(12) United States Patent
Whalen et al.

(10) Patent No.: US 9,708,728 B1
(45) Date of Patent: Jul. 18, 2017

(54) GROWTH OF METAL OXIDE SINGLE CRYSTALS FROM ALKALINE-EARTH METAL FLUXES

(75) Inventors: Jeffrey Brian Whalen, Tallahassee, FL (US); Theo Siegrist, Tallahassee, FL (US)

(73) Assignee: The Florida State University Research Foundation, Inc., Tallahassee, FL (US)

( * ) Notice: Subject to any disclaimer, the term of this patent is extended or adjusted under 35 U.S.C. 154(b) by 853 days.

(21) Appl. No.: 13/550,050

(22) Filed: Jul. 16, 2012

Related U.S. Application Data

(60) Provisional application No. 61/507,828, filed on Jul. 14, 2011.

(51) Int. Cl.
*C30B 19/02* (2006.01)
*C30B 15/00* (2006.01)
*C30B 9/10* (2006.01)
C30B 29/22 (2006.01)

(52) U.S. Cl.
CPC ............... *C30B 15/00* (2013.01); *C30B 9/10* (2013.01); *C30B 19/02* (2013.01); *C30B 29/22* (2013.01)

(58) Field of Classification Search
CPC  C30B 19/00; C30B 9/00; C30B 17/00; C30B 29/22; C30B 29/30; C30B 15/12; C30B 15/305; C30B 19/06; C30B 19/12
See application file for complete search history.

(56) References Cited

U.S. PATENT DOCUMENTS

| | | | | |
|---|---|---|---|---|
| 4,277,274 | A * | 7/1981 | Chrisman | 65/29.17 |
| 5,055,445 | A * | 10/1991 | Belt | C30B 19/02 117/23 |
| 5,366,583 | A * | 11/1994 | Kurosaka | C30B 15/00 117/3 |
| 5,632,811 | A * | 5/1997 | Namikawa | C30B 9/00 117/1 |
| 5,851,956 | A * | 12/1998 | Namikawa | C30B 15/00 117/13 |
| 6,231,779 | B1 * | 5/2001 | Chiang | B82Y 15/00 117/63 |

(Continued)

OTHER PUBLICATIONS

P. C. Canfield and Z. Fisk, "Growth of single crystals from metallic fluxes," in Phil. Mag. B, 1992, V 65, (6), pp. 1117-1123.*

(Continued)

*Primary Examiner* — Matthew Song
(74) *Attorney, Agent, or Firm* — Robert J. Varkonyi; David P. Hendricks; Smith & Hopen, P.A.

(57) ABSTRACT

A process for the growth of new, and difficult-to-synthesize, metal oxide, and other mixed anion oxide-based, single crystals from a molten metal flux. Metal fluxes are new for the growth of metal oxide single crystals. Preliminary reactions proved that new phases and phases that normally require costly, extreme conditions do grow as single crystals. Batches of individual reactions are heat-treated to synthesize single crystals comprised of oxygen with one or more transition, alkaline-earth and/or lanthanide metals, and can also include other anions like chalcogens or pnictogens, or halides. The reactivity and the propensity for crystallization of charge compensated single crystals from alkaline earth fluxes have been made evident by the results presented here.

15 Claims, 4 Drawing Sheets

(56) References Cited

U.S. PATENT DOCUMENTS

| | | | | |
|---|---|---|---|---|
| 7,842,133 B2* | 11/2010 | Iwai et al. | | 117/19 |
| 2004/0177800 A1* | 9/2004 | Funahashi | | C30B 1/02 |
| | | | | 117/2 |
| 2006/0124050 A1* | 6/2006 | Tarrant | | C30B 9/00 |
| | | | | 117/19 |
| 2008/0112046 A1* | 5/2008 | Ohido | | C30B 19/02 |
| | | | | 359/484.1 |

OTHER PUBLICATIONS

Muller, M., Miao, G. X. and Moodera, J. S. Exchange splitting and bias-dependent transport in EuO spin filter tunnel barriers. Europ. Phys. Lett. 88, 47006 (2009).

Borukhovich, A. S., Ignat'Eva, N. I., Galyas, A. I., Dorofeichik, S. S. and Yanushkevich, K. I. Thin-film ferromagnetic composite material for spintronics. JETP Lett. 84, 502-504 (2006).

Borukhovich, A. S., Ignat'Eva, N. I., Galyas, A. I., Demidenko, O. F., Fedotova, Y. A., Stognii, A. I. and Yanushkevich, K. I. Superparamagnetism of the ferromagnetic composite material EuO : Fe for spintronics. J. Nanoeletr. Optoelectr. 3, 82-85 (2008).

Shafer, M. W., Torrance, J. B. and Penney, T. Relationship of Crystal-Growth Parameters to Stoichiometry of EuO as Determined by Ir and Conductivity Measurements. J. Phys. Chem. Sol. 33, 2251-2266 (1972).

Llinares, C., Desfours, J. P., Nadai, J. P., Godart, C., Perchero.A and Achard, J. C. Electrical Transport Properties of EuO Single-Crystal in Relation with Growth Parameters. Phys. Stat. Sol. A—Appl. Res. 25, 185-192 (1974).

Fischer, K. J., Kobler, U., Stroka, B., Bickmann, K. and Wenzl, H. Growth of EuO Crystals by a Solution Sintering Process. J. Cryst. Growth 128, 846-851 (1993).

Karunadasa, H., Huang, Q., Ueland, B. G., Lynn, J. W., Schiffer, P., Regan, K. A. and Cava, R. J. Honeycombs of triangles and magnetic frustration in $SrL_2O_4$ (L=Gd, Dy, Ho, Er, Tm, and Yb). Phys. Rev. B 71, 144414 (2005).

Reid, A. F. Calcium Ytterbate: $CaYb_2O_4$, an orthorhombic calcium ferrite isomorph. J. Amer. Ceram. Soc. 50, 491-493 (1967).

Barry, T. L., Stubiocan, V. S. and Roy, R. Decomposition Kinetics of $CaYb_2O_4$. J. Amer. Ceram. Soc. 50, 375-380 (1967).

Maekawa, T., Kurosaki, K. and Yamanaka, S. Thermophysical properties of $BaY_2O_4$: A new candidate material for thermal barrier coatings. Mater. Lett. 61, 2303-2306 (2007).

Kanatzidis, M.G., Pöttgen, R. and Jeitschko, W. The metal flux: A preparative tool for the exploration of intermetallic compounds. Angew. Chem. Int. Ed. 44, 6996-7023 (2005).

Shi, Y. G., Guo, Y. F., Yu, S., Arai, M., Sato, A., Belik, A. A., Yamaura, K. and Takayama-Muromachi, E., Crystal Growth and Structure and Magnetic Properties of the 5d Oxide $Ca_3LiOsO_6$: Extended Superexchange Magnetic Interaction in Oxide. J. Amer. Chem. Soc. 132, 8474-8483 (2010).

Toulemonde, P., Darie, C., Goujon, C., Legendre, M., Mendonca, T., Alvarez-Murga, M., Simonet, V., Bordet, P., Bouvier, P., Kreisel, J. and Mezouar, M., Single crystal growth of $BiMnO_3$ under high pressure-high temperature. High Press. Res. 29, 600-604 (2009).

Konigstein, M. Structural properties of nonstoichiometric barium and strontium peroxides: $BaO_2-x(1.97 \geq 2-x \geq 1.72)$ and $SrO_2-x(1.98 \geq 2-x \geq 1.90)$. J. Solid State Chem. 147, 478-484 (1999).

Latturner, S. E. and Kanatzidis, M. G. $Re(AuAl_2)nAl_2(AuxSi_{1-x})_2$: A New Homologous Series of Quaternary Intermetallics Grown from Aluminum Flux. Inorg. Chem. 47, 2089-2097 (2008).

Stojanovic, M. and Latturner, S. E., Growth of new ternary intermetallic phases from Ca/Zn eutectic flux. J. Solid State Chem. 180, 907-914 (2007).

Hessen, B., Sunshine, S. A., Siegrist, T. and Jimenez, R. Crystallization of reduced strontium and barium niobate perovskites from borate fluxes. Mat. Res. Bull. 26, 85-90 (1991).

Akimoto, J., Gotoh, Y. and Oosawa, Y. Synthesis and Structure Refinement of $LiCoO_2$ Single Crystals. J. Solid State Chem. 141, 298-302 (1998).

Parker, S. G. and Chang, C. T. M. Influence of Growth-Conditions on the Properties of Small Diameter Bubble Garnet-Films Grown from $PbO-B_2O_3$ Flux. J. Cryst. Growth 55, 438-446 (1981).

Tegel, M., Bichler, D. and Johrendt, D. Synthesis, crystal structure and superconductivity of LaNiPO. Solid State Sci. 10, 193-197 (2008).

Ni, N., Bud'Ko, S. L., Kreyssig, A., Nandi, S., Rustan, G. E., Goldman, A. I., Gupta, S., Corbett, J. D., Kracher, A. and Canfield, P. C. Anisotropic thermodynamic and transport properties of single-crystalline $Ba_{1-x}K_xFe_2As_2$ (x=0 and 0.45). Phys. Rev. B 78, 014507 (2008).

Brown, S. R., Kauzlarich, S. M., Gascoin, F. and Snyder, G. J. $Yb_{14}MnSb_{11}$: New High Efficiency Thermoelectric Material for Power Generation. Chem. Mater. 18, 1873-1877 (2006).

Jeitschko, W., Brink, R. and Pollmeier, P. G. The Ternary Uranium Transition-Metal Phosphides $UV_5P_3$, $UCr_5P_3$, and $UMn_5P_3$. Z. Naturforschung B 48, 52-57 (1993).

Jeitschko, W., Wallinda, J., Dewalsky, M. V. and Wortmann, U. Preparation, Properties, and Structure of the Polyphosphides $VNi_4P_{16}$, $NbNi_4P_{16}$, and $WNi_4P_{16}$. Z. Naturtorschung B 48, 1774-1780 (1993).

Jeitschko, W., Foecker, A. J., Paschke, D., Dewalsky, M. V., Evers, C. B. H., Kunnen, B., Lang, A., Kotzyba, G., Rodewald, U. C. and Moller, M. H. Crystal structure and properties of some filled and unfilled skutterudites: $GdFe_4P_{12}$, $SmFe_4P_{12}$, $NdFe_4As_{12}$, $Eu_{0.54}Co_4Sb_{12}$, $Fe_{0.5}Ni_{0.5}P_3$, $CoP_3$, and $NiP_3$. Z. Anorg. Allg. Chem. 626, 1112-1120 (2000).

Singh, Y., Lee, Y., Nandi, S., Kreyssig, A., Ellern, A., Das, S., Nath, R., Harmon, B. N., Goldman, A. I. and Johnston, D. C. Single-crystal growth and physical properties of the layered arsenide $BaRh_2As_2$. Phys. Rev. B 78, 104512 (2008).

Wang, H. F., Cai, K. F., Li, H., Wang, L. and Zhou, C. W. Synthesis and thermoelectric properties of $BaMn_2Sb_2$ single crystals. J. Alloys Comp. 477, 519-522 (2009).

Joshi, D.A., Nagalakshimi, R., Kulkarni, R., Dhar, S.K. and Thamizhavel, A. Crystal growth and anisotropic magnetic properties of $RAg_2Ge_2$ (R = Pr, Nd and Sm) single crystals. Physica B—Cond. Matter 404, 2988-2991 (2009).

Christensen, M., Johnsen, S. and Iversen, B. B. Host Structure Engineering in Thermoelectric Clathrates. Chem. Mater. 19, 4896-4905 (2007).

Frontiers in Crystalline Matter: From Discovery to Technology; National Research Council, Washington, D.C., 2009.

B. Hessen, S. A. Sunshine and T. Siegrist, New Reduced Ternary Titanates from Borate Fluxes, Journal of Solid State Chemistry, 94 (1991), pp. 306-312.

T. Siegrist, H. W. Zandbergen, R. J. Cava, J. J. Krajewski and W. F. Peck, The Crystal-Structure of Superconducting $LuNi_2B_2C$ and the Related Phase LuNiBC. Nature, 367 (1994), pp. 254-256.

A. L. Prieto, T. Siegrist and L. F. Schneemeyer, New barium manganese titanates prepared under reducing conditions, Solid State Sciences, 4 (2002), pp. 323-327.

T. Siegrist and T. A. Vanderah, Combining Magnets and dielectrics: Crystal Chemistry in the $BaO-Fe_2O_3-TiO_2$ System, European Journal of Inorganic Chemistry, (2003), pp. 1483-1501.

T. Kimura, Y. Sekio, H. Nakamura, T. Siegrist, A. P. Ramirez, Cupric oxide as an induced-multiferroic with high-Tc, Nature Materials, 7, 291-294 (2008).

H. D. Zhou, E. S. Choi, Y. J. Jo, L. Balicas, J. Lu, L. L. Lumata, R. R. Urbano, P.L. Kuhns, A. P. Reyes, J. S. Brooks, R. Stillwell, S. W. Tozer, C. R. Wiebe, J. Whalen, and T. Siegrist, Metamagnetic transition in single-crystal $Bi_4Cu_3V_2O_{14}$, Phys. Rev. B 82, 054435 (2010).

P. Bag, M. E. Itkis, S. K. Pal, B. Donnadieu, F. S. Tham, H. Park, J. A. Schlueter, T. Siegrist, and R. C. Haddon, J. Amer. Chem. Soc. 132, 2684-94 (2010).

H. Mizoguchi, A.P. Ramirez, T. Siegrist, L. N. Zakharov, A. W. Sleight, and M. A. Subramanian, Possible Verwey-Type Transition in $Pb_3Rh_7O_{15}$, Chem. Mater. 21, 2300-5 (2009).

(56) References Cited

OTHER PUBLICATIONS

Michael A. Heinrich, Jens Pflaum, Ashutosh K. Tripathi, Wolfgang Frey, Michael L. Steigerwald, and Theo Siegrist, Enantiotropic polymorphism in Di-Indenoperylene, J. Phys. Chem. C, 111, 18878 (2007).

Latturner, S. E., Bilc, D., Mahanti, S. D. and Kanatzidis, M. G., R3Au6+xAl26T(R=Ca,Sr,Eu,Yb; T=Early Transition Metal): a Large Family of Compounds with a Stuffed BaHg11 Structure Type Grown from Aluminum Flux, Inorg. Chem. 48, 1346-1355 (2009).

Shi, Y. G., Guo, Y. F., Yu, S., Arai, M., Belik, A. A., Sato, A., Yamaura, K., Takayama-Muromachi, E., Varga, T. and Mitchell, J. F., High-pressure crystal growth and magnetic and electrical properties of the quasi-one dimensional osmium oxide Na2OsO4, J. Solid State Chem. 183, 402-407 (2010).

Ulbricht, R. W., Schmehl, A., Heeg, T., Schubert, J. and Schlom, D. G., Adsorption-controlled growth of EuO by molecular-beam epitaxy. Appl. Phys. Lett. 93, 102105 (2008).

R. J. Cava, H. Takagi, H. W. Zandbergen, J. J. Krajewski, W. F. Peck Jr., T. Siegrist, B. Batlogg, R. B. Van Dover, R. J. Felder, K. Mizuhashi, J. O. Lee, H. Eisaki, and S. Uchida. Superconductivity in the quaternary intermetallic compounds LnNi2B2C. Nature, vol. 367, pp. 252-253. Jan. 20, 1994.

Junggeburth, C., Oeckler, O., Johrendt, D. and Schnick, W., Nitridogermanate Nitrides Sr7[GeN4]N2 and Ca7[GeN4]N2: Synthesis Employing Sodium Melts, Crystal Structure, and Density-Functional Theory Calculations. Inorg. Chem. 47, 12018-12023 (2008).

\* cited by examiner

GROWTH OF METAL OXIDE SINGLE CRYSTALS FROM ALKALINE-EARTH METAL FLUXES

CROSS-REFERENCE TO RELATED APPLICATIONS

This nonprovisional application is a continuation of and claims priority to provisional application No. 61/507,828 entitled "Growth of Metal Oxide Single Crystals from Alkaline-Earth Metal Fluxes," filed on Jul. 14, 2011.

BACKGROUND OF THE INVENTION

1. Field of the Invention

This invention relates to metal oxide crystals. More specifically, the invention discloses a method using alkaline earth fluxes for generating new and difficult-to-grow metal oxide crystals.

2. Brief Description of the Related Art

Discovery and Growth of Crystalline Materials (DGCM) has been recently identified as key area for materials research (*Frontiers in Crystalline Matter: From Discovery to Technology*; National Research Council, Washington, D.C., 2009). Single crystals are needed to fully characterize physical properties of materials with possible semiconductor applications, optical materials, energy conversions materials and detectors. Original and unique growth processes will spearhead discovery efforts by exploring specialized synthesis pathways to both new and desirable single crystalline materials.

Traditional growth processes do not possess the exploratory edge of a new method that develops original techniques into reliable, reproducible processes that can be further applied to numerous systems. The current state of the art for growth of metal oxide single crystals often involves temperatures in excess of 1000° C., and occasionally high pressure. In the past, p-block metal fluxes have been applied almost exclusively to the growth of intermetallic and other non-oxide phases (Kanatzidis, M. G., Pöttgen, R. and Jeitschko, W. *The metal flux: A preparative tool for the exploration of intermetallic compounds*. Angew. Chem. Int. Ed. 44, 6996-7023 (2005)), such as the clathrate-type system $Ba_8Al_{16}Ge_{30}$ (Christensen, M., Johnsen, S. and Iversen, B. B. *Thermoelectric clathrates of type I*. Chem. Mater. 19, 4896-4905 (2007)), or intermetallic phases of the $ThCr_2Si_2$-type (Joshi, D. A., Nagalakshmi, R., Kulkarni, R., Dhar, S. K. and Thamizhavel, A. *Crystal growth and anisotropic magnetic properties of $RAg_2Ge_2$ ($R=Pr$, Nd and Sm) single crystals*. Physica B—Cond. Matter 404, 2988-2991 (2009); Wang, H. F., Cai, K. F., Li, H., Wang, L. and Zhou, C. W. *Synthesis and thermoelectric properties of $BaMn_2Sb_2$ single crystals*. J. Alloys Comp. 477, 519-522 (2009); Singh, Y., Lee, Y., Nandi, S., Kreyssig, A., Ellern, A., Das, S., Nath, R., Harmon, B. N., Goldman, A. I. and Johnston, D. C. *Single-crystal growth and physical properties of the layered arsenide $BaRh_2As_2$*. Phys. Rev. B 78, 104512 (2008)). In particular, tin fluxes have been used on many occasions to grow complex poly-phosphide phases containing extended phosphorus-phosphorus bonding (Jeitschko, W., Foecker, A. J., Paschke, D., Dewalsky, M. V., Evers, C. B. H., Kunnen, B., Lang, A., Kotzyba, G., Rodewald, U. C. and Moller, M. H. *Crystal structure and properties of some filled and unfilled skutterudites: $GdFe_4P_{12}$, $SmFe_4P_{12}$, $NdFe_4As_{12}$, $Eu_{0.5}4Co_4Sb_{12}$, $Fe_{0.5}Ni_{0.5}P_3$, $CoP_3$, and $NiP_3$*. Z. Anorg. Allg. Chem. 626, 1112-1120 (2000); Jeitschko, W., Wallinda, J., Dewalsky, M. V. and Wortmann, U. *Preparation, Properties, and Structure of the Polyphosphides $VNi_4P_{16}$, $NbNi_4P_{16}$, and $WNi_4P_{16}$*. Z. Naturforschung B 48, 1774-1780 (1993); Jeitschko, W., Brink, R. and Pollmeier, P. G. *The Ternary Uranium Transition-Metal Phosphides $UV_5P_3$, $UCr_5P_3$, and $UMn_5P_3$*. Z. Naturforschung B 48, 52-57 (1993)), as well as tetrelides, pnictides, such as the thermoelectric materials $Yb_{14}MnSb_{11}$ (Brown, S. R., Kauzlarich, S. M., Gascoin, F. and Snyder, G. J. $Yb_{14}MnSb_{11}$: *New High Efficiency Thermoelectric Material for Power Generation*. Chem. Mater. 18, 1873-1877 (2006)), the superconducting phases $Ba_{1-x}K_xFe_2As_2$ (Ni, N., Bud'ko, S. L., Kreyssig, A., Nandi, S., Rustan, G. E., Goldman, A. I., Gupta, S., Corbett, J. D., Kracher, A. and Canfield, P. C. *Anisotropic thermodynamic and transport properties of single-crystalline $Ba_{1-x}K_xFe_2As_2$ ($x=0$ and 0.45)*. Phys. Rev. B 78, 014507 (2008)) and LaNiPO (Tegel, M., Bichler, D. and Johrendt, D. *Synthesis, crystal structure and superconductivity of LaNiPO*. Solid State Sci. 10, 193-197 (2008)), to mention just a few.

In contrast, flux growth of oxides normally involves the use of oxide or salt fluxes. As an example, garnet growth from $PbO-B_2O_3$ fluxes has been optimized to give large single crystals (Parker, S. G. and Chang, C. T. M. *Influence of Growth-Conditions on the Properties of Small Diameter Bubble Garnet-Films Grown from $PbO-B_2O_3$ Flux*. J. Cryst. Growth 55, 438-446 (1981)). Other examples include the $LiCoO_2$ battery electrode material synthesized from $Li_2O/LiCl$ flux and highly reduced alkaline earth niobate crystals from borate fluxes. (Akimoto, J., Gotoh, Y. and Oosawa, Y. *Synthesis and Structure Refinement of $LiCoO_2$ Single Crystals*. J. Solid State Chem. 141, 298-302 (1998); Hessen, B., Sunshine, S. A., Siegrist, T. and Jimenez, R. *Crystallization of reduced strontium and barium niobate perovskites from borate fluxes*. Mat. Res. Bull. 26, 85-90 (1991)).

3. Problems to be Solved by the Invention

There lacks a process that generates a favorable environment to produce oxide single crystals at low temperatures and pressures. The prior art lacks the methodology to use temperatures below 1000° C. and not apply pressure. A new, less expensive or faster method of growing metal oxides will have significant value to industry and government, while providing an avenue for potential new discoveries.

However, in view of the art considered as a whole at the time the present invention was made, it was not obvious to those of ordinary skill in the field of this invention how the shortcomings of the prior art could be overcome.

BRIEF SUMMARY OF THE INVENTION

The long-standing but heretofore unfulfilled need for a method that uses metal fluxes for generating new and difficult-to-grow metal oxide crystals is now met by a new, useful, and nonobvious invention.

The novel method of growing crystals includes selecting a metallic element or metal oxide and a different metal or mixture of metals with a low melting point. A preferred embodiment of the invention includes selecting a metallic element or metal oxide and an alkaline earth metal or mixture of alkaline earth metals. The predetermined molar ratio of selected metals are then placed into a suitable metal crucible under an inert atmosphere, preferably an argon atmosphere. In a preferred embodiment the metal crucible is made from stainless steel, Nb, Ta, or W. After the metal crucible is sealed it is placed in a quartz tube. The quartz tube is then placed under a vacuum and sealed. The crucible is heated to form a homogeneous melt and create an alkaline earth metal flux. The crucible is then heated to a growth temperature up to about 1000° C. After the crucible is heated to growth temperature the melt is slowly cooled. The slow cooling of the melt results in the growing of single crystals where the newly formed crystals are later removed. In another embodiment the newly formed crystals are removed in an inert atmosphere. Oxides, oxychalcogenides, chalcogenides, oxyhydrides, hydrides, oxycarbides, carbides, oxypnictides, pnictides, mixed-chalcogenides, mixed-pnictides, oxyhalide, chalcohalide, pnictohalide or halide group phase single crystals can be grown.

In a preferred embodiment the metallic element can be a lanthanide, a transition metal, or a combination of the two. Selection of the lanthanide or transition metal varies depending on the desired results. The transition metal can take the form of any 3d, 4d, 5d or 6d transition metal oxide. An additional step of including a p-block metalloid to the alkaline earth metal can be performed. The lanthanide can be selected from the group consisting of any f-block element or oxide form.

In a preferred embodiment the alkaline earth metal can be selected from either magnesium, calcium, strontium or barium, or a combination of those. In another embodiment some of the oxygen may be introduced into the alkaline earth metals in the form of an alkaline earth monoxide powder comprising MgO, CaO, SrO, or BaO.

While the preferred embodiment has the argon at an atmospheric pressure of about 1 atm argon, it is foreseeable that various pressures and different inert gases and noble gases may be used. In one embodiment the crystals are grown in the substantial absence of applied pressure. It is also foreseeable that the slow cooling rate can vary. In a preferred embodiment the cooling rate is approximately 1-2° C./hour. The cooling rate can also vary depending on the desired crystal formation.

In a preferred embodiment the melt is maintained at the maximum temperature for 10-30 hours. Additional steps in the heating process may be conducted to the melt to provide varying results. Additives can also be included in the melt where the additives are selected from the group consisting of alkali metals, Group 13, Group 14 elements, pnictogens, or chalcogens.

The fluxes may vary in compositions, but are generally about more than 90 atomic % alkaline-earth. It is possible to have a metal flux that is pure alkaline earth or an alkaline earth mixed alloy. Small volume (~1-3 cc) batch reactions are conducted using a predetermined composition and temperature recipe based on target products. During the process the metal flux can become separated from the target products using inversion and centrifugation of the crucible. In a preferred embodiment the temperature of the crystallization process is maintained to ensure the metal flux remains molten and crystals remain solid during centrifugation.

Various embodiments and methods exist for using the crucible. The crucible can have a circulation system to circulate the melt. In a preferred embodiment the circulation is performed by a pump. The crucible can be embodied to include a frit or a filter. During the process the crucible can be heated to a solvation temperature at a predetermined rate and maintain that temperature and dwell time at a predetermined time. Cooling of the crucible can occur at specific rates aimed at the specific target product. In a preferred embodiment the atmosphere of 1.5 atm Ar is maintained in the crucible. Additives can also be added to the crucible, wherein the additives are alkali metals, Group 13, Group 14 elements, pnictogens, or chalcogens.

BRIEF DESCRIPTION OF THE DRAWINGS

For a fuller understanding of the invention, reference should be made to the following detailed description, taken in connection with the accompanying drawings, in which.

DETAILED DESCRIPTION OF THE PREFERRED EMBODIMENT

Figure 1:
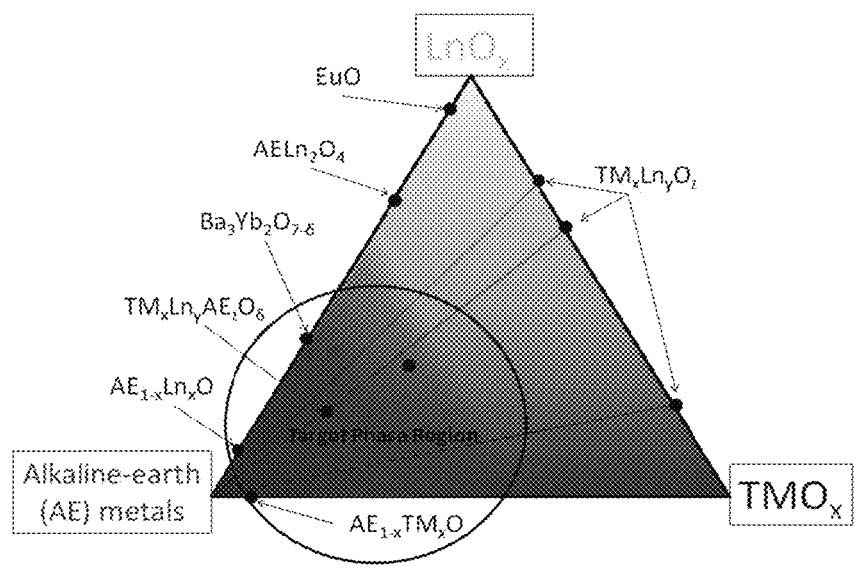
FIG. 1 is an image showing phase region defined by the alkaline earth flux, lanthanide oxides and transition element oxides to be investigated for potential new phases.
Figure 2:
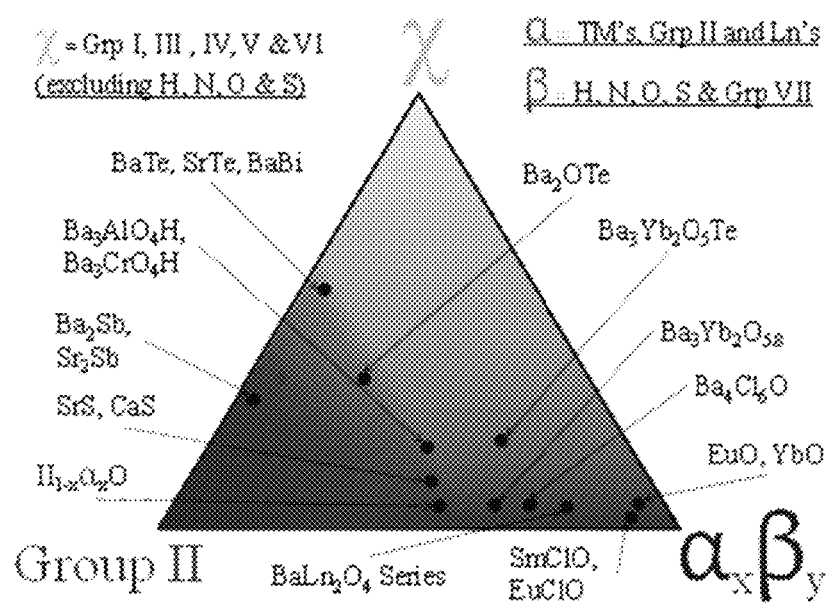
FIG. 2 is an image showing an extended target phase diagram
Figure 3:
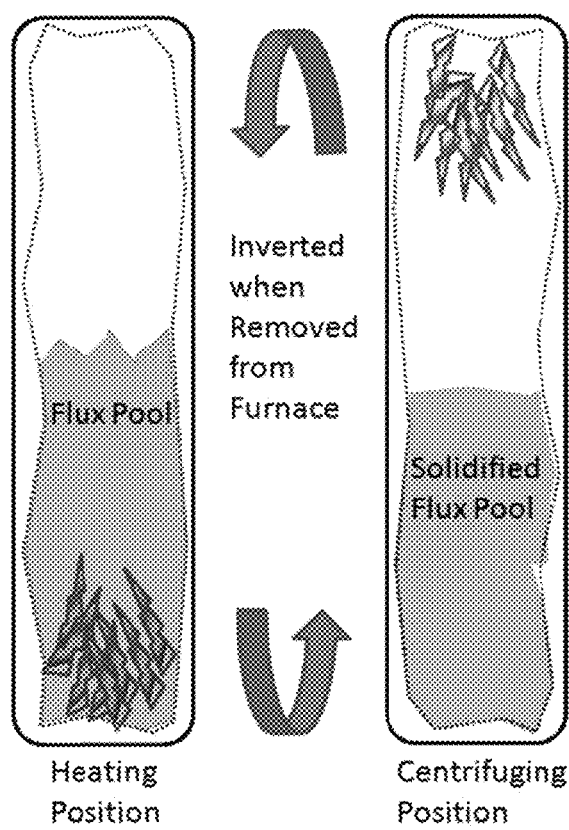
FIG. 3 shows a diagram depicting an embodiment of centrifugation separation

In the following detailed description of the preferred embodiment, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

For the following defined terms, these definitions shall be applied, unless a different definition is given in the claims or elsewhere in this specification.

As used in this specification and the appended claims, the singular forms "a", "an", and "the" include plural referents unless the content clearly dictates otherwise. As used in this specification and the appended claims, the term "or" is generally employed in its sense including "and/or" unless the context clearly dictates otherwise.

As used herein, "about" means approximately or nearly and in the context of a numerical value or range set forth means ±15% of the numerical.

As used herein, the term "metal flux" means a mixture of metals that is comprised mostly, but not exclusively, of one or more alkaline earth metals.

Synthesis experiments have indicated high oxygen solubility and mobility in alkaline earth metal fluxes, which is a critical factor in ensuring a high level of crystallinity in the products. Simultaneously, low growth temperatures are desirable coupled with low cost crucible materials. The molten alkaline earth flux creates a unique oxide crystal growth environment and may further allow control of dopant substitution, electron transfer and phase selectivity. Since alkaline earth metals readily form solid solutions with lanthanide metals, complex intermetallic phases have been grown (Stojanovic, M. and Latturner, S. E. *Growth of new ternary intermetallic phases from Ca/Zn eutectic flux*. J. Solid State Chem. 180, 907-914 (2007); Latturner, S. E., Bilc, D., Mahanti, S. D. and Kanatzidis, M. G. $R_3Au_{6+x}Al_{26}T$ (R=Ca,Sr,Eu,Yb; T=Early Transition Metal): a Large Family of Compounds with a Stuffed $BaHg_{11}$ Structure Type Grown from Aluminum Flux. Inorg. Chem. 48, 1346-1355 (2009); Latturner, S. E. and Kanatzidis, M. G. $RE(AuAl_2)$ $nAl_2(Au_xSi_1-x)_2$: *A New Homologous Series of Quaternary Intermetallics Grown from Aluminum Flux*. Inorg. Chem. 47, 2089-2097 (2008)). The alkaline earth flux can be further modified to include transition elements as well, expanding the possibilities of discovery of new phases.

The relatively low density of alkaline earth metals (*Periodic Table of the Elements*. (Sargent-Welch Scientific Company, Skokie, Ill., 1980)) are often lower than the densities of oxide phases which therefore remain better embedded in the melt, and will therefore remain in a favorable crystal growth environment.

The process outlined here is developed in conjunction with apparatus design to create a system that can scale up the dimensions of the produced crystals to maximize size.

The stoichiometric synthesis of metal oxide single crystals very often requires temperatures above 1000° C. due to the high thermodynamic stability of these phases (Villars, P., ASM Alloy Phase Diagrams. (ASM International, Materials Park, Ohio, 2006)). Single element, binary eutectic and arbitrary ratio alkaline earth fluxes have relatively low electronegativities ($E_N$) and thus can dissociate/reduce certain metal oxides at temperatures below 1000° C. The lanthanide cations are similar in size and $E_N$ to the alkaline earth cations. This relative atomic congruency results in homogeneous lanthanide-alkaline earth melts with high-ion mobility capable of dissolving and crystallizing oxygen containing phases. Most alkaline earth elements form solid solutions with each other, with the exception of magnesium, where deep eutectics are the norm. Inclusion of magnesium therefore allows tailoring the overall $E_N$, while simultaneously lowering the melting temperature, with the possibility to grow reduced oxide phases at moderate temperatures. The rare earth elements Sm, Eu and Yb have both trivalent and divalent states, and reduced oxides with these constituents may be accessible. In fact, as will be described below, EuO growth at moderate temperatures is possible, starting from the sesquioxide $Eu_2O_3$, according to $Mg+Eu_2O_3 \rightarrow MgO+2EuO$.

Most alkaline earth metals and p-block metalloids have naturally low melting points, making reactive melts possible at low temperatures. During traditional stoichiometric growths, high pressure and high temperatures are often combined to produce even more extreme conditions, (Konigstein, M. *Structural properties of nonstoichiometric barium and strontium peroxides: $BaO_2$-x(1.97>=2-x>=1.72) and $SrO_2$-x(1.98>=2-x>=1.90)*. J. Solid State Chem. 147, 478-484 (1999); Shi, Y. G., et al. *High-pressure crystal growth and magnetic and electrical properties of the quasi-one dimensional osmium oxide $Na_2OsO_4$*. J. Solid State Chem. 183, 402-407 (2010); Toulemonde, P., et al. *Single crystal growth of $BiMnO_3$ under high pressure-high temperature*. High Press. Res. 29, 600-604 (2009); Shi, Y. G., et al. *Crystal Growth and Structure and Magnetic Properties of the 5d Oxide $Ca_3LiOsO_6$: Extended Superexchange Magnetic Interaction in Oxide*. J. Amer. Chem. Soc. 132, 8474-8483 (2010)) and single crystal oxide phases have been synthesized successfully using high pressure-high temperature methods. However, creating such extreme thermo-physical conditions is often costly and energy inefficient compared to low temperature techniques. The alkaline earth metal fluxes operate in a very different (low temperature) part of the accessible phase space compared to high-temperature methods. Furthermore, the alkaline earth metal melts have high vapor pressure, reducing boiling out oxygen or oxides.

Slow cooling of the alkaline earth metal flux from about 1000° C. kinetically forces oxygen anion-metal cation organization that is high in cation concentration due to the presence of the flux. This bonding in the liquid flux can be relatively weak compared to more oxygen-rich combinations of the same ion pairs, allowing crystal growth. The use of eutectic mixtures therefore allows for a temperature reduction well below the critical precipitation temperature for most oxide phases, effectively pitting thermal kinetic energy losses in competition with increased crystal lattice energies. This balance of equilibrium factors, combined with quick removal of the liquid solvent environment (quench), can lead to exclusive stabilization and isolation of metastable phases not formed at ambient temperatures and pressures.

Crystals grown using alkaline earth fluxes can involve site selective incorporation of alkaline earth metals into lanthanide oxides to form charge-balanced ordered ternary compounds, or solid solution with random substitution of the alkaline earth cations onto lanthanide crystallographic sites. The multivalent lanthanides Sm, Eu and Yb have different radii based on valence, smaller for trivalent and larger for divalent states, making them particularly interesting in this work. Producing reduced oxides by stabilizing the divalent state, or producing a mixed valence system, where both $Ln^{2+}$ and $Ln^{3+}$ are simultaneously present, induces interesting or applicable optical, electronic and magnetic properties phenomena in these crystals. Similarly, Ce and Pr have 3+/4+ oxidation states thus providing more opportunities to produce crystals with different arrangement of charge balances, with the possibility of electron or hole doping of such crystals.

Transition metal cations tend to have smaller sizes and greater $E_N$ value than alkaline earth or Lanthanide cations, necessitating different crystallization conditions. To form ordered multinary phases and not only transition element substituting in alkaline earth oxides (such as (Mg, Co)O), the alkaline earth flux must have an increased $E_N$. This can be accomplished by incorporation of other metals, such as Al, Ga, Zn, Sn, Pb, Sb, Bi, into the alkaline earth flux mixtures, effectively lowering further the overall reaction temperature while raising the $E_N$ of the molten solution to dissociate the starting materials. New crystallographically ordered alkaline earth-transition metal oxides, alkaline earth-lanthanide oxides or alkaline earth-lanthanide-transition metal oxides will be the main focus. Incorporation of transition elements into new reduced oxide phases is expected to yield single crystals with potentially interesting optical, magnetic and electronic properties that can be tuned by controlling transition element concentration in the melt.

Based on the elements and their concentrations in the flux, the relative $E_N$ of the flux must be greater than that of the starting material (oxides) to cause dissociation of the starting material. If the flux is of comparable $E_N$ to the reactant oxides, then stable phases can form that do not involve full dissociation, but may still incorporate the flux into the product crystals. If the flux $E_N$ is lower than that of the starting oxide reactants, the flux acts purely as a growth environment and crystals may be grown that do not incorporate any of the flux. The composition of the final crystals growing in the flux may therefore be tuned by changing the ratio and elemental make-up of the alkaline earth flux thus applying chemical strain/pressure to the systems.

Preliminary alkaline earth flux reactions have yielded single crystals of new and known metal oxide phases. The propensity for precipitation of alkaline earth-lanthanide oxide single crystals is evidenced by the high yields (>90% molar product) and compositional consistency of the crystals. Single crystals have been obtained in fully ordered form as well as doped/substituted variants by varying the reaction constituents. Separate reactions have produced the same single crystal phases from different alkaline earth, transition metal and lanthanide oxide starting reactants. This shows that oxygen anions are dissociated from the starting material and subsequently crystallize with the most favorable metal cations in the most energetically favored arrangement.

Transparent yellowish golden-colored single crystal rods of $BaYb_2O_4$, averaging 3 mm×0.1 mm×0.1 mm in size, were synthesized from a pure Ba flux containing $Yb_2O_3$. An analogous reaction containing other lanthanide sesquoxides, instead of $Yb_2O_3$, produced varying colored single crystals of the generalized stoichiometry $BaLn_2O_4$ (where Ln=all 4f lanthanides except Pm and Lu) of similar dimensions. The compounds all form in the orthorhombic $CaV_2O_4$ structure type and have very similar unit cell parameters. Many more alkaline-earth lanthanide oxides with 1:2:4 stoichiometry exhibit this structure type, but none of these $BaLn_2O_4$ phases have been reported in single crystal form (Villars, P. and Cenzual, K. *Pearson's Crystal Data* (ASM International, Materials Park, Ohio, USA, 2009)).

The analogous phase, $BaY_2O_4$, is currently under investigation as a promising thermal barrier coating (Maekawa, T., Kurosaki, K. and Yamanaka, S. *Thermophysical properties of $BaY_2O_4$: A new candidate material for thermal barrier coatings*. Mater. Lett. 61, 2303-2306 (2007)), and is accessible using the methods described.

Only a few of the other analogous family members, including $SrLn_2O_4$ (Ln=Yb,Tb) and $CaLn_2O_4$ (Ln=Yb,Lu), have been previously synthesized in single crystal form. (Villars, P. and Cenzual, K. *Pearson's Crystal Data* (ASM International, Materials Park, Ohio, USA, 2009); Barry, T. L., Stubican, V. S. and Roy, R. *Decomposition Kinetics of $CaYb_2O_4$*. J. Amer. Ceram. Soc. 50, 375-380 (1967); Reid, A. F. *Calcium Ytterbate: $CaYb_2O_4$, an orthorhombic calcium ferrite isomorph*. J. Amer. Ceram. Soc. 50, 491-493 (1967)). A number of the $AELn_2O_4$ (AE=alkaline earth) compounds melt congruently, allowing for previous efforts using solid-state techniques for polycrystalline or microcrystalline samples preparation to be successful, but requiring temperatures in excess of 1400° C. (Karunadasa, H., Huang, Q., Ueland, B. G., Lynn, J. W., Schiffer, P., Regan, K. A. and Cava, R. J. *Honeycombs of triangles and magnetic frustration in $SrL_2O_4$ (L=Gd, Dy, Ho, Er, Tm, and Yb)*. Phys. Rev. B 71, 144414 (2005)). In addition, many of the members exhibit moderate to severe air/moisture sensitivity. The alkaline earth flux, in contrast, allows for synthesis of oxide single crystals at temperatures below 1000° C. and without the oxidative constraints of heating in open crucibles under air.

$Ba_3Yb_2O_6\text{-}\delta$

Single crystals of $Ba_3Yb_2O_6\text{-}\delta$ in the form of transparent plates with a bluish tinge were obtained from a eutectic Ba—Mg flux (13 mol Ba:7 mol Mg). $Ba_3Yb_2O_6\text{-}\delta$ crystallizes in the tetragonal $Sr_3Ti_2O_7$ structure type, with unit cell parameters of a=4.329(1) Å, c=22.67(2) Å. This phase has not been reported in the literature as of to date. (Villars, P. and Cenzual, K. *Pearson's Crystal Data* (ASM International, Materials Park, Ohio, USA, 2009)). This phase does not form from either a pure Ba or Mg flux.

The crystals described obtained in our study demonstrate the versatility of this alkaline earth flux synthesis method, but a better understanding of the expanded possibilities of single crystals growth requires further studies.

EuO

Single crystals of EuO, in excess of 2 $mm^3$ were grown from several different alkaline earth eutectic flux mixtures, starting with $Eu_2O_3$. The EuO crystals have the simple cubic NaCl "rock salt"-type structure (a=5.142 Å). EDS measurements confirmed the presence of Eu in the crystals at >96 at. % with <4 at. % alkaline earth impurities from incorporation of the flux eutectic mixture. The exact metal cation stoichiometry can be varied by changing the flux composition, resulting in substituted phases, such as $Eu_{1-x}SrxO$ and $Eu_{1-x-y}Ba_xMg_yO$ using Sr or (Ba, Mg) fluxes respectively. This reaction is another example of a phase accessible by crystallization in low melting, highly reductive solvents. Recent reports of EuO growth have focused on thin film synthesis, with less attention to the growth of faceted macroscopic single crystals. EuO single crystals were previously grown using high temperature techniques above 1000° C. (Fischer, K. J., Kobler, U., Stroka, B., Bickmann, K. and Wenzl, H. *Growth of EuO Crystals by a Solution Sintering Process*. J. Cryst. Growth 128, 846-851 (1993); Llinares, C., Desfours, J. P., Nadai, J. P., Godart, C., Perchero. A and Achard, J. C. *Electrical Transport Properties of EuO Single-Crystal in Relation with Growth Parameters*. Phys. Stat. Sol. A—Appl. Res. 25, 185-192 (1974); Shafer, M. W., Torrance, J. B. and Penney, T. *Relationship of Crystal-Growth Parameters to Stoichiometry of EuO as Determined by IR and Conductivity Measurements*. J. Phys. Chem. Sol. 33, 2251-2266 (1972)).

As seen above, single crystal growth of EuO is possible at temperatures well below 1000° C. Since EuO is a ferromagnetic semiconductor, possible applications include spin filters and spin injection devices for spintronics applications. (Borukhovich, A. S., Ignat'eva, N. I., Galyas, A. I., Demidenko, O. F., Fedotova, Y. A., Stognii, A. I. and Yanushkevich, K. I. *Superparamagnetism of the ferromagnetic composite material EuO: Fe for spintronics*. J. Nanoeletr. Optoelectr. 3, 82-85 (2008); Borukhovich, A. S., Ignat'eva, N. I., Galyas, A. I., Dorofeichik, S. S. and Yanushkevich, K. I. *Thin-film ferromagnetic composite material for spintronics*. JETP Lett. 84, 502-504 (2006); Muller, M., Miao, G. X. and Moodera, J. S. *Exchange splitting and bias-dependent transport in EuO spin filter tunnel barriers*. Europ. Phys. Lett. 88, 47006 (2009)).

Doped Alkaline-Earth Monoxides

Several "rock salt-type" alkaline earth oxides readily formed fluxes containing transition elements or lanthanides, such as $(Sr_{1-x}T_x)O$ with T=Ti, V, Ni, Nb, Mo, W, Ln. Their cubic rock salt-type unit cell lengths vary with alkaline earth cation size from about 4.2 Å for MgO, to 5.5 Å for BaO. (Villars, P. and Cenzual, K. *Pearson's Crystal Data* (ASM International, Materials Park, Ohio, USA, 2009)). The doping of these alkaline earth monoxides with transition and lanthanide cations can easily be recognized due to color changes of the resulting crystals. Pure alkaline earth monoxides are clear. Alkaline earth monoxide powders (MgO, CaO, SrO, BaO) can also be used as starting oxygen source materials so that the dopant cation concentrations in the final products can be adjusted independently.

Carbides and Hydrides

Reaction of fluxes that are rich in Ba or Sr, in some cases, leached carbon from the stainless steel crucibles to form minor products of $BaC_2$ and $SrC_2$, respectively. $BaC_2$ crystallizes in the tetragonal $CaC_2$-type structure with unit cell parameters of a=4.366(3) Å, and c=7.091(7) Å. These side reactions confirmed good solubility and crystallization conditions for alkaline earth carbides and hydrides. Elemental carbon may be deliberately added and consequently, the yield of alkaline earth carbide crystals increased. These results further prove that potentially, ternary and quaternary hydride and carbide phases should be accessible, due to the high solubility of hydrogen and carbon in alkaline earth fluxes.

Description for Small Batch Reactions

Figure 4:
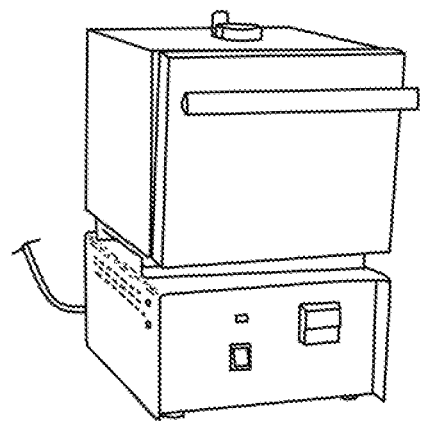
FIG. 4 depicts standard heating equipment used to conduct the method.

The desired ratios of flux and starting materials are calculated with the general formula of about 20 mmols of flux, 1-3 mmols of additive (optional) and 1-2 mmol of metal oxide starting material. The additives are elements that modify the $E_N$ or lower the melting point of the flux, it is not used in every reaction, but certain phases require the use of an additive in order to form. The reactions were prepared in a sealed (TIG welded) metal crucible suitable for the alkaline-earth flux, usually 304/304L stainless steel, tantalum or niobium. Metal tubing with ¼" ID×⁵⁄₁₆" OD is cut into 3.5-4.5" sections, the first end of the tube is welded, and the tube is moved to an inert gas atmosphere glove box and the reactants and flux material are then loaded and the opposite end of the tube is welded to create a sealed crucible with about 1.5 atm Ar gas atmosphere inside. The metal crucible is further sealed in a quartz tube under vacuum creating a cylindrical double jacketed reaction vessel about ½" diameter and 5" long. The reaction vessels are arranged upright and heated in a small muffle furnace according to a desired heating profile, see FIG. 4.

The use of about 1000° C. max temperature is sufficient to fully melt any alkaline-earth based flux, but centrifugation temperature varies according to the solidification temperature of the chosen flux. The centrifugation temperature must be at least 100° C. above the solidification temperature of the flux to ensure the flux will remain liquid for the time needed to transfer it from the furnace to the centrifuge.

At the end of the heating run, the reaction vessels are removed from the furnace one-by-one and with the flux still molten inside the vessel, inverted and briefly centrifuged to separate the flux from the product crystals. Once the reaction vessels have cooled, the glass is broken open and the crucible is cut open so the product crystals can be scraped out.

$Ba_3CrO_4H$

Opaque green rod shaped crystals of $Ba_3CrO_4H$ were synthesized from a Ba—Mg eutectic flux (65 at % Ba, 35 at % Mg) which was centrifuged at 600° C., using either BaO, or MgO and $Cr_2O_3$ as starting materials; $Cr_2O_3$ yielding the largest crystals. This compound has hexagonal-P symmetry with unit cell parameters of a=b=8.02 Å, c=5.62 Å.

YbO

The divalent monoxide crystals of YbO were obtained from $Yb_2O_3$ starting materials in several mixed alkaline earth fluxes. YbO crystals are only produced from alkaline-earth solvents with high overall $E_N$, such as Mg—Ca, Mg—Sr, Ca—Al eutectics. YbO crystallizes with cubic (Fm-3m) NaCl structure type having unit a cell parameter of 4.87 Å.

$BaLn_2O_4$ Family of Compounds

Mixed Chalcogens

The flux reactions in this work have produced mixed chalcogen phases from separate oxide and other chalcogen starting materials. $Ba_3YbO_5Te$ was grown from a pure Ba flux with added Te and $Yb_2O_3$. Additionally, $Ba_2TeO$ was grown from a pure Ba flux with Te and BaO added. The $Ba_2TeO$ crystals have shown flexibility in co-crystallizing with other additives in the melt such as Sb, Se and Bi. Mixed oxide-chalcogen phases will be targeted, as well as mixed chalcogen-chalcogen phases not containing oxygen.

Oxy-Hydrides

The addition of metal hydride starting materials resulted in the growth of oxy-hydride single crystals. This phase crystallizes with orthorhombic Pnma symmetry and unit cell parameters of a=10.47 Å, b=8.15 Å, c=7.23 Å. Other oxy-hydrides have been observed in the reactions of this work, but their structure and stoichiometry has not yet fully been confirmed.

Single crystal X-ray diffraction is an excellent tool for fast analysis of the crystals, coupled with energy dispersive spectroscopy measurements for elemental analysis.

The reaction conditions applied to growing crystals presented herein used empirical, and in some cases, arbitrary conditions to establish roughly the necessary growth parameters for particular lanthanide oxides. The crystals obtained included new and difficult to crystallize phases, without optimization of growth conditions.

Additional new phases were investigated as depicted in FIG. 1. Since using alkaline metal fluxes, the growth region is located close to the lower left-hand corner of the triangle formed by alkaline earths, lanthanide oxides ($LnO_x$) and transition metal oxides ($TMO_x$). Data show that phases are found along the line alkaline earths—$LnO_x$, with $BaLn_2O_4$ and $Ba_3Yb_2O_{7-\delta}$ as examples, and along the line alkaline earths—$TMO_x$, with doped $(Sr_{1-x}Nb_x)O$ as example.

It will be seen that the advantages set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also understood that the following claims are intended to cover all of the generic and specific features of the invention herein described, and all statements of the scope of the invention which, as a matter of language, might be said to fall there between.

GLOSSARY OF CLAIM TERMS

Alkali metals: metallic elements found in the first group of the periodic table. Generally, very reactive metals that do not occur freely in nature.

Alkaline-Earth metals: metallic elements found in the second group of the periodic table. Generally, very reactive metals that do not occur freely in nature.

Argon: Chemical element (Ar) with atomic number 18. It is a noble gas.

Crucible: A container that can withstand very high temperatures and is used for metal, glass, and pigment production as well as various other modern laboratory processes.

Crystal: solid material whose constituent atoms, molecules, or ions are arranged in an orderly, repeating pattern extending in all three spatial dimensions.

Chalcogens: chemical elements in group 16 of the periodic table. This group is generally known as the oxygen family.

Dopant: Trace impurity element that is inserted into a substance in order to alter the electrical properties or the optical properties of the substance.

Lanthanide series: comprises the fifteen metallic chemical elements with atomic numbers 57 through 71.

Pnictogens: a chemical term for chemical elements or compounds containing elements from group 15.

Rare-Earth: Found in group 3 of the periodic table, and the $6^{th}$ and $7^{th}$ periods. Composed of the lanthanide and actinide series.

Transition metal: The IUPC defines a transition metal as "an element whose atom has an incomplete d sub-shell, or which can give rise to cations with an incomplete d sub-shell." Generally used to describe any element in the d-block of the periodic table.

What is claimed is:

1. A method of growing single crystals, comprising the steps of:

selecting a metallic element;

selecting an alkaline earth metal in excess of said metallic element, wherein said alkaline earth metal is capable of dissolving oxygen;

placing said metallic element and said alkaline earth metal in excess of said metallic element into a crucible;

adding an oxygen to said crucible, wherein said oxygen is part of a metal oxide;

placing said metallic element, said alkaline earth metal in excess of said metallic element, and said oxygen under an inert atmosphere or vacuum in said crucible and sealing said crucible;

placing said crucible in a quartz tube and placing said quartz tube under a vacuum;

sealing said quartz tube;

heating said metallic element and said alkaline earth metal in said crucible to form a homogeneous melt;

generating a metal flux comprising one or more metals, said metal flux having metals in excess of oxygen, a solubility for oxygen as a minority constituent, and a total concentration of anions of between about 3.5 percent and about 20 percent;

heating said crucible to a growth temperature less than 1000° C.;

slow cooling said metal flux from said growth temperature; and removing newly formed oxide crystals from said crucible, wherein said oxide crystals are single crystalline or polycrystalline.

2. The method of claim 1, wherein said metallic element is a lanthanide.

3. The method of claim 2, further comprising the step of selecting said lanthanide from the group consisting of Y, La, Ce, Pr, Nd, Sm, Eu, Gd, Tb, Dy, Ho, Er, Tm, Yb, and Lu.

4. The method of claim 1, wherein said metallic element is a transition metal.

5. The method of claim 4, wherein said transition metal is in the form of a transition metal oxide.

6. The method of claim 1, wherein said metallic element is a mixture of lanthanide and transition metals.

7. The method of claim 4, wherein said alkaline earth metal in excess is selected from the group consisting of Mg, Ca, Sr, and Ba.

8. The method of claim 1, further comprising the step of providing said oxygen in the form of an alkaline earth monoxide powder comprising MgO, CaO, SrO, or BaO.

9. The method of claim 1, further comprising the step of adding a chalcogen to said crucible, wherein said chalcogen is S, Se, or Te.

10. The method of claim 1, further comprising the step of removing said oxide single crystals in an inert atmosphere.

11. The method of claim 1, further comprising the step of growing said oxide crystals in the substantial absence of applied pressure.

12. The method of claim 1, further comprising the step of heating said crucible to a solvation temperature at a predetermined rate and maintaining that temperature for a predetermined dwell time.

13. The method of claim 1, wherein said metallic element is an actinide.

14. The method of claim 13, further comprising the step of selecting said actinide from the group consisting of Ac, Th, U, Np, Pu, and Am.

15. The method of claim 1, further comprising the step of adding a pnictogen to said crucible, wherein said pnictogen is P, As, Sb, or Bi.

* * * * *